Feb. 2, 1971

J. M. SHAW 3,560,357

ELECTROETCHING OF A CONDUCTIVE FILM ON AN INSULATING SUBSTRATE

Filed July 26, 1968

BY

INVENTOR
JOSEPH M. SHAW

ATTORNEY

United States Patent Office 3,560,357

Patented Feb. 2, 1971

3,560,357

ELECTROETCHING OF A CONDUCTIVE FILM ON AN INSULATING SUBSTRATE

Joseph M. Shaw, Cranbury, N.J., assignor to RCA Corporation, a corporation of Delaware Filed July 26, 1968, Ser. No. 747,960
Int. Cl. C23b *3/04;* C23f *1/02*
U.S. Cl. 204—143 2 Claims

ABSTRACT OF THE DISCLOSURE

A tungsten film is etched electrolytically in a solution which also acts as a chemical etchant. The chemical action of the etchant removes the last traces of tungsten after the electrolytic etching action is terminated by break-up of the tungsten layer into a number of thin electrically isolated "islands."

BACKGROUND OF THE INVENTION

This invention relates to the selective etching of conductive films, and more particularly to electrolytic etching of such films disposed on insulating substrates.

In the manufacture of electrical circuits in general, and semiconductor integrated circuits in particular, electrical interconnections between active and/or passive elements disposed on a suitable substrate (usually comprising semiconductor material) are provided by (i) depositing an insulating layer on the substrate surface, and forming holes in the insulating layer exposing contact areas of the elements to be interconnected, (ii) depositing a metallic film on the insulating layer, the film extending to the element contact areas through the holes in the insulating layer, and (iii) selectively etching the metallic film to define the desired interconnection pattern.

In order to remove the undesired portion of the metallic film, a layer of a suitable masking material is deposited on the film in accordance with the desired pattern. The masking material is resistant to an etching solution which is capable of attacking the metallic film. When the substrate is immersed in the etching solution, the portion of the metallic film not covered by the masking layer is removed by chemical reaction with the etchant.

The sharpness of definition of the interconnection pattern in the metallic film is limited by the ability of the masking layer to withstand the etching solution. Where it is desired to selectively etch films of relatively inert metals such as, e.g., tungsten, the strong etching solutions necessary attack or undercut the masking layer, causing loss of pattern resolution.

SUMMARY OF THE INVENTION

A process is provided for removing a selected portion of an electrically conductive film. The portion to be removed is disposed on an insulating surface.

An electrically insulating layer is disposed on the conductive film. The insulating layer has at least one aperture exposing the selected portion of the film. The film is immersed in an electrolyte which is capable of chemically etching the film. The electrolyte is capable of electrolytically etching the film at a rate substantially greater than the chemical etching rate when a predetermined current density is established at the exposed surface of said selected portion, by applying a predetermined potential difference between the electrolyte and the film. The predetermined potential difference is applied to establish said predetermined current density. When the thickness and lateral conductivity of the film decreases substantially, thereby decreasing the effectiveness of the electrolytic etching, any remaining parts of the selected portion are removed by the chemical etching action of the electrolyte.

IN THE DRAWING

DETAILED DESCRIPTION

Figure 1:
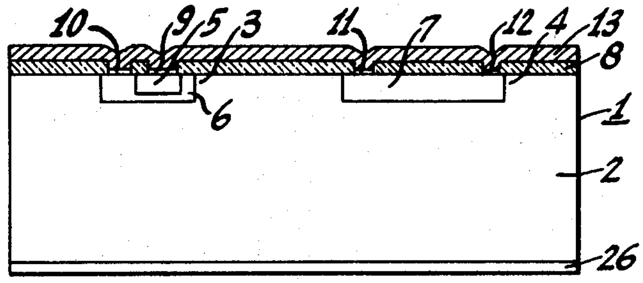
FIG. 1 shows a cross-sectional view of an integrated circuit at an intermediate stage of manufacture according to the invention.

The integrated circuit 1, shown in FIG. 1 at an intermediate stage of manufacture, comprises a silicon substrate 2 of, e.g., N type conductivity having a transistor 3 and resistor 4 formed therein by conventional planar diffusion processes. The transistor 3 comprises an N type emitter region 5, a P type base region 6 and the adjacent portion of the N type substrate 2, which acts as the collector region of the transistor. The resistor 4 comprises a diffused P type region 7.

A silicon dioxide layer 8 overlies the surface of the substrate 2 adjacent the transistor 3 and resistor 4. The silicon dioxide layer 8 has holes therein exposing contact areas of the transistor 3 and resistor 4.

Thin (on the order of 1000 to 1200 Angstroms) tungsten electrodes 9 and 10 provide electrical contact to the emitter region 5 and base region 6 of the transistor 3, respectively. Similarly, thin tungsten electrodes 11 and 12 provide ohmic contact to spaced portions of the P type region 7 of the resistor 4.

Ohmic contact to the substrate 2 is provided by a deposited nickel or gold layer 26 on the surface of the substrate opposite that on which the silicon dioxide layer 8 is disposed.

A metallic, electrically conductive tungsten film 13 is disposed on the silicon dioxide layer 8. The tungsten film 13, which may typically have a thickness on the order of 1 micron, adheres to the underlying silicon dioxide layer 8 and to the tungsten electrode layers 9, 10, 11 and 12 through corresponding holes in the silicon dioxide layer 8.

The manner in which the integrated circuit structure 1, as shown in FIG. 1, may be fabricated is described in copending U.S. patent application Ser. No. 580,933, filed Sept. 21, 1966, (entitled "Method of Depositing Refractory Metals") and assigned to the assignee of the instant application. U.S. patent application Ser. No. 580,933 is incorporated herein by reference and made a part of this specification.

The structure shown in FIG. 1 corresponds to that shown in FIG. 5 of application Ser. No. 580,933.

In order to form the desired electrical interconnection pattern, i.e., an electrical connection between the emitter electrode of the transistor 3 and the electrode 11 of the resistor 4, and to electrically isolate the various electrodes of the transistor 3 and resistor 4, it is necessary to selectively etch the tungsten film 8 to remove the undesired portions thereof.

Where a metallic film to be etched comprises a relatively active metal such as the evaporated aluminum commonly employed for this purpose, the film is usually selectively etched by depositing a masking layer comprising, e.g., photoresist on the film portions to be retained. The film is then imersed in an etching solution to which the photoresist is chemically resistant, so that only the exposed portions of the film are removed.

Efforts to selectively etch relatively inactive metals such as tungsten by this method have, however, proven unsatisfactory, since the strong etching solutions required to dissolve the tungsten attack the edges of the photoresist masking layer, resulting in poor definition of the resultant interconnection pattern.

I have found that since the tungsten film 13 to be removed is not disposed on a conductive substrate (portions of the film 13 to be removed overlie the silicon dioxide layer 8), conventional electrolytic etching techniques cannot be employed, because the final stages of the electrolytic etching process result in the film 13 becoming so thin that the lateral conductivity of the film decreases to an unacceptably low value, and the film breaks up into a number of electrically isolated "islands" disposed on the insulating substrate 8. When this point is reached, the electrolytic etching action essentially ceases, leaving the undesired residue of relatively thin film portions and isolated "islands" on the surface of the silicon dioxide layer 8.

By employing an electrolyte which also exhibits a chemical etching action, however, this residue is removed chemically by the electrolyte after the electrolytic etching action ceases. Preferably, the electrolyte should produce an electrolytic etching rate substantially greater than its chemical etching rate, so that the electrolytic etching effect predominaes initially, thus yielding high pattern resolution.

Figure 2:
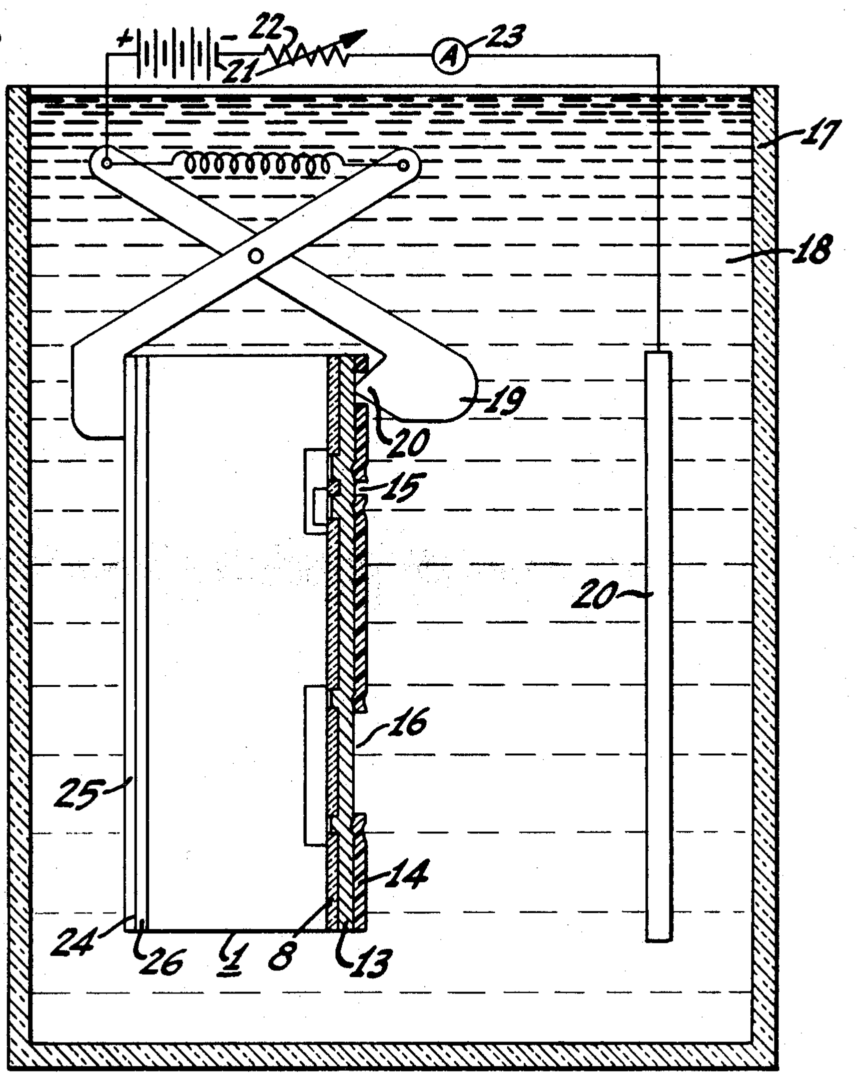
FIG. 2 shows the manner in which an interconnection pattern is defined for the integrated circuit of FIG. 1.

In order to electrolytically etch the tungsten film 13, the exposed surface of the film 13 is covered with a suitable electrically insulating layer 14 (see FIG. 2) such as that sold by Eastman Kodak Company under the trade designation KTFR (Kodak Thin Film Resist). The photoresist layer 14 is then photoetched by conventional methods to form apertures 15 and 16 therein exposing the portions of the tungsten film 13 to be removed. The photoresist layer 14 is highly resistant to the chemical etching action of the electrolyte employed to remove the undesired portions of the tungsten film 13.

In order to electrolytically etch the film 13, the substrate 1 is immersed in a container 17 filled with a liquid electrolyte 18. Electrical contact to the film 13 is provided by means of a stainless steel spring clip 19 coated with an insulating material such as polytetrafluoroethylene. The spring clip 19 has an uncoated tapered portion 20 which extends through a small hole in the photoresist layer 14 to contact the underlying portion of the film 16.

Electrical contact to the electrolyte 18 is provided by a plate 20 comprising a relatively inert metal such as platinum.

Electrolytic etching is initiated by applying a potential difference between the tungsten film 13 and the electrolyte 18 by means of a battery 21 and variable series resistor 22 electrically connected between the spring clip 19 and the plate 20. The battery 21 is biased so that the tungsten film 13 is relatively positive with respect to the electrolyte 18. An ammeter 23 indicates the electrolytic current, the variable resistor 22 being adjusted so that the current density at the surface portions of the tungsten film 13 exposed by the apertures 15 and 16 is on the order of 0.1 amp/cm.$^2$. The back surface 24 of the substrate 1 may be coated with an insulating layer 25 (comprising wax or photoresist), so that current flow is confined substantially to the exposed portions of the tungsten film 13.

The electrolyte 18 may comprise an alkaline ferricyanide which is capable of chemically etching the tungsten film 13 at a rate substantially less than the electrolytic etching rate thereof.

A suitable electrolyte may be prepared by mixing equal volumes of (i) a 10% (by weight) aqueous solution of sodium hydroxide, and (ii) a 10% (by weight) aqueous solution of potassium ferricyanide. It is desirable to add 5% (by volume) of a suitable wetting agent, such as a 20% (by weight) aqueous solution of polyalkaline glycol ether to the resultant electrolyte. For this electrolyte, a 22½ to 45 volt battery is a convenient potential source. At a current density on the order of 0.1 amp/cm.$^2$ at the exposed surface of the tungsten film 13, the electrolyte etching rate at 25° C. is approximately 100 Angstroms/second, while the chemical etching rate of this electrolyte is approximately 50 angstroms/second. Eching is rapid, about 30 seconds being required to remove on the order of 0.5 micron of tungsten.

As the electrolytic etching action progresses, a point is reached where the tungsten film begins to break up, this effect being evidenced by an abrupt drop in electrolytic current as indicated by the ammeter 23. A few seconds after the rapid decrease of current flow begins to level off (this usually occurs at 25 to 35% of the full electrolytic current), the electrolytic etching process is terminated by disconnecting the battery 21 from the circuit.

For the aforementioned potassium ferricyanide/sodium hydroxide electrolyte, the ratio of electrolytic to chemical etching rates is 2:1, under the conditions described. Therefore, the chemical etching action has a relatively small effect, serving to remove the small residual electrically isolated "islands" which cannot by effectively etched by electrolytic action. The resultant pattern definition is excellent, comparing favorably with the resolution of the best patterns which can be prepared in aluminum films at the present state of the art. While other electrolytes may be employed, the ratio of electrolytic to chemical etching rates should preferably be at least 2:1, but not greater than 50:1 for optimum pattern definition, a ratio on the order of 5:1 being preferred.

The technique described above is applicable to the etching of other electrically conductive films disposed on insulating surfaces, by providing an electrolyte which exhibits a chemical etching rate substantially less than its electrolytic etching rate for removal of the conductive film.

After the electrolytic/chemical etching of the tungsten film 13 in the manner described above, the substrate 1 is removed from the electrolyte 18, (if desired) the photoresist layer 14 is removed by immersing in a suitable stripping reagent, such as that sold by Indust-Ri-Chem-Labs under the trade designation J–100.

Figure 3:
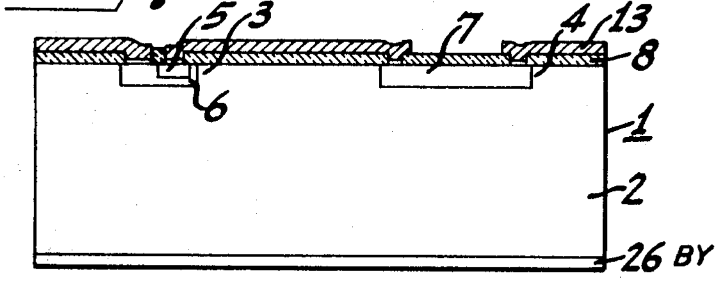
FIG. 3 shows the completed integrated circuit after processing according to the preferred embodiment of the invention.

The resultant integrated circuit 1 is as shown in FIG. 3, and resembles the structure shown in FIG. 6 of U.S. pat. application Ser. No. 580,933.

I claim:

1. A process for removing a selected portion of an electrically conductive tungsten film, said portion being disposed on an insulating surface, comprising the steps of:

disposing an electrically insulating layer on said film, said layer having at least one aperture therein exposing said selected portion;

providing an electrolyte consisting essentially of an alkali metal ferricyanide capable of chemically etching said conductive film at a given rate, said electrolyte being capable of electrolytically etching said film at a rate substantially greater than said given rate when a predetermined current density is established at the exposed surface of said selected portion, by applying a predetermined potential difference between said electrolyte and said film;

immersing said film in said electrolyte; and applying said predetermined potential difference between said electrolyte and said film to establish said predetermined current density, thereby removing substantially by electrolytic etching all of said selected portions of said film, except low lateral conductivity thin parts thereof, said parts being removed substantially by the chemical etching action of said electrolyte.

2. A process according to claim 1, wherein said electrolyte comprises 1 volumetric part of a 10% (by weight) aqueous solution of sodium hydroxide and 1 volumetric part of a 10% (by weight) aqueous solution of potassium ferricyanide.

References Cited

UNITED STATES PATENTS 3,325,384 6/1967 Frantzen ............ 204—143

FOREIGN PATENTS 1,380,991 10/1964 France ............ 204—143

ROBERT K. MIHALEK, Primary Examiner

U.S. Cl. X.R.

156—7